US009876473B2

(12) United States Patent
Khesbak et al.

(10) Patent No.: US 9,876,473 B2
(45) Date of Patent: *Jan. 23, 2018

(54) APPARATUS AND METHODS FOR WIDEBAND ENVELOPE TRACKING

(71) Applicant: SKYWORKS SOLUTIONS, INC., Woburn, MA (US)

(72) Inventors: Sabah Khesbak, Irvine, CA (US); Florinel G. Balteanu, Irvine, CA (US); Hardik Bhupendra Modi, Irvine, CA (US)

(73) Assignee: SKYWORKS SOLUTIONS, INC., Woburn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/222,746

(22) Filed: Jul. 28, 2016

(65) Prior Publication Data
US 2016/0336901 A1 Nov. 17, 2016

Related U.S. Application Data

(63) Continuation of application No. 14/754,118, filed on Jun. 29, 2015, now Pat. No. 9,445,371.
(Continued)

(51) Int. Cl.
*H04W 52/02* (2009.01)
*H03F 1/02* (2006.01)
(Continued)

(52) U.S. Cl.
CPC ............ *H03F 1/0227* (2013.01); *H03F 3/19* (2013.01); *H03F 3/245* (2013.01);
(Continued)

(58) Field of Classification Search
CPC ............ H03F 1/0227; H03F 2200/102; H03F 2200/336; H03F 2200/451; H03F 3/19;
(Continued)

(56) References Cited

U.S. PATENT DOCUMENTS 5,264,752 A  11/1993 Savicki
6,407,634 B1  6/2002 Staudinger et al.
(Continued)

FOREIGN PATENT DOCUMENTS

GB  2398648  8/2004
GB  2409115  11/2006
(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.
(Continued)

*Primary Examiner* — Tan H Trinh
(74) *Attorney, Agent, or Firm* — Knobbe Martens Olson & Bear LLP

(57) ABSTRACT

Apparatus and methods for wideband envelope tracking systems are disclosed herein. In certain implementations, an envelope tracker includes a DC-to-DC converter, a current digital-to-analog converter (DAC), an error amplifier, a feedback circuit, and an AC combiner. The current DAC receives a digital envelope signal, and uses the digital envelope signal to generate an envelope current. The feedback circuit is connected between an output and an inverting input of the error amplifier, and the envelope current is provided to the error amplifier's inverting input. Additionally, the AC combiner generates a power amplifier supply voltage by combining an output of the DC-to-DC converter and an output of the error amplifier.

20 Claims, 8 Drawing Sheets

Related U.S. Application Data

(60) Provisional application No. 62/036,960, filed on Aug. 13, 2014, provisional application No. 62/069,558, filed on Oct. 28, 2014.

(51) Int. Cl.
  *H03F 3/19* (2006.01)
  *H03F 3/45* (2006.01)
  *H03F 3/68* (2006.01)
  *H03F 3/24* (2006.01)

(52) U.S. Cl.
  CPC ..... *H03F 3/45179* (2013.01); *H03F 3/45192* (2013.01); *H03F 3/68* (2013.01); *H04W 52/0261* (2013.01); *H03F 2200/102* (2013.01); *H03F 2200/336* (2013.01); *H03F 2200/451* (2013.01); *Y02B 60/50* (2013.01)

(58) Field of Classification Search
  CPC .. H03F 3/245; H03F 3/45179; H03F 3/45192; H03F 3/68; H04W 52/0261
  USPC .... 455/574, 63, 126, 571; 330/51, 136, 251, 330/127, 149, 10, 297, 302, 129, 295, 330/199, 285, 296, 131; 323/282
  See application file for complete search history.

(56) References Cited

U.S. PATENT DOCUMENTS

| | | | |
|---|---|---|---|
| 6,583,664 B2* | 6/2003 | Mathe | H03F 1/0222 330/10 |
| 6,914,487 B1* | 7/2005 | Doyle | H03F 1/0222 330/129 |
| 7,482,869 B2* | 1/2009 | Wilson | H03F 1/025 330/127 |
| 8,094,764 B2 | 1/2012 | Lackey | |
| 8,587,377 B2 | 11/2013 | Khesbak et al. | |
| 8,803,605 B2 | 8/2014 | Fowers et al. | |
| 8,947,162 B2* | 2/2015 | Wimpenny | H03F 1/0227 330/127 |
| 9,065,385 B2* | 6/2015 | Gorbachov | H03F 1/30 |
| 9,066,368 B2 | 6/2015 | Lorenz et al. | |
| 9,445,371 B2* | 9/2016 | Khesbak | H04W 52/0261 |
| 9,668,215 B2* | 5/2017 | Balteanu | H04W 52/0225 |
| 2002/0030543 A1 | 3/2002 | French et al. | |
| 2002/0101912 A1 | 8/2002 | Phelts et al. | |
| 2003/0155978 A1* | 8/2003 | Pehlke | H03F 1/025 330/296 |
| 2004/0198271 A1 | 10/2004 | Kang | |
| 2005/0064830 A1 | 3/2005 | Grigore | |
| 2005/0110562 A1* | 5/2005 | Robinson | H03F 1/0227 330/10 |
| 2006/0119425 A1* | 6/2006 | Phillips | H03F 1/0227 330/51 |
| 2007/0210771 A1 | 9/2007 | Wilson et al. | |
| 2007/0249304 A1 | 10/2007 | Snelgrove et al. | |
| 2007/0273449 A1 | 11/2007 | Wilson | |
| 2007/0279019 A1 | 12/2007 | Wilson | |
| 2008/0238387 A1* | 10/2008 | Schmeller | H02M 3/156 323/282 |
| 2009/0004981 A1 | 1/2009 | Eliezer et al. | |
| 2009/0016086 A1* | 1/2009 | Huynh | H02M 3/33523 363/80 |
| 2009/0097591 A1 | 4/2009 | Kim | |
| 2009/0128236 A1 | 5/2009 | Wilson | |
| 2009/0289720 A1 | 11/2009 | Takinami et al. | |
| 2009/0302941 A1 | 12/2009 | Wimpenny | |
| 2011/0058601 A1 | 3/2011 | Kim et al. | |
| 2012/0139641 A1* | 6/2012 | Kaczman | H03F 1/0222 330/295 |
| 2012/0146731 A1* | 6/2012 | Khesbak | H03F 1/0222 330/295 |
| 2012/0200354 A1* | 8/2012 | Ripley | H03F 1/0227 330/131 |
| 2012/0201065 A1 | 8/2012 | Nate et al. | |
| 2012/0269240 A1 | 10/2012 | Balteanu et al. | |
| 2012/0326783 A1 | 12/2012 | Mathe et al. | |
| 2013/0034139 A1 | 2/2013 | Khlat et al. | |
| 2013/0109441 A1 | 5/2013 | Lorenz et al. | |
| 2013/0109442 A1 | 5/2013 | Dakshinamurthy et al. | |
| 2013/0116017 A1 | 5/2013 | Zhang et al. | |
| 2013/0127548 A1 | 5/2013 | Popplewell et al. | |
| 2013/0200864 A1* | 8/2013 | Huang | H02M 3/156 323/271 |
| 2013/0207731 A1* | 8/2013 | Balteanu | H03F 1/02 330/296 |
| 2013/0217345 A1 | 8/2013 | Balteanu et al. | |
| 2013/0231069 A1 | 9/2013 | Drogi | |
| 2013/0293210 A1* | 11/2013 | Smith | H02M 3/1584 323/282 |
| 2014/0049321 A1* | 2/2014 | Gebeyehu | H03G 3/30 330/279 |
| 2014/0218109 A1* | 8/2014 | Wimpenny | H03F 3/217 330/251 |
| 2014/0240052 A1 | 8/2014 | Mao | |
| 2014/0300334 A1* | 10/2014 | Popplewell | H03F 1/0227 323/282 |
| 2014/0306763 A1* | 10/2014 | Hong | H03F 3/195 330/291 |
| 2014/0361830 A1* | 12/2014 | Mathe | H03F 1/02 330/127 |
| 2014/0361837 A1 | 12/2014 | Strange et al. | |
| 2015/0009980 A1 | 1/2015 | Modi et al. | |
| 2015/0105033 A1 | 4/2015 | Modi et al. | |
| 2015/0188432 A1 | 7/2015 | Vannorsdel et al. | |
| 2015/0236654 A1* | 8/2015 | Jiang | H03F 1/0233 330/279 |
| 2015/0270806 A1 | 9/2015 | Wagh et al. | |
| 2015/0365053 A1* | 12/2015 | Wimpenny | H03F 1/0227 330/84 |
| 2016/0006396 A1 | 1/2016 | Wimpenny | |
| 2016/0006397 A1* | 1/2016 | Wimpenny | H03F 1/0227 330/297 |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A MASH Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

(56) References Cited

OTHER PUBLICATIONS

Yousefzadeh et al. "Three-Level Buck Converter for Envelope Tracking Applications," IEEE Transactions on Power Electronics, vol. 21, No. 2, Mar. 2006, pp. 549-552.

* cited by examiner

APPARATUS AND METHODS FOR WIDEBAND ENVELOPE TRACKING

CROSS-REFERENCE TO RELATED APPLICATIONS

This application is a continuation of U.S. patent application Ser. No. 14/754,118, filed Jun. 29, 2015 and titled "APPARATUS AND METHODS FOR WIDEBAND ENVELOPE TRACKING SYSTEMS," which claims the benefit of priority under 35 U.S.C. § 119(e) of U.S. Provisional Patent Application No. 62/069,558, filed Oct. 28, 2014 and titled "APPARATUS AND METHODS FOR WIDEBAND ENVELOPE TRACKING SYSTEMS," and of U.S. Provisional Patent Application No. 62/036,960, filed Aug. 13, 2014 and titled "APPARATUS AND METHODS FOR WIDEBAND ENVELOPE TRACKING SYSTEMS," each of which are herein incorporated by reference in their entireties.

BACKGROUND

Field

Embodiments of the invention relate to electronic systems, and in particular, to envelope tracking systems for radio frequency (RF) electronics.

Description of the Related Technology

Power amplifiers can be included in mobile devices to amplify radio frequency (RF) signals for transmission via antennas. For example, in mobile devices using frequency division duplexing (FDD), such as systems using long term evolution (LTE), a power amplifier can be used to provide amplification to one or more transmit carrier frequencies. It can be important to manage RF signal amplification, as a desired transmit power level can depend on how far the user is away from a base station and/or the mobile environment.

The power consumption of a power amplifier can be an important consideration. One technique for reducing power consumption of a power amplifier is envelope tracking, in which a supply voltage of the power amplifier is controlled in relation to the envelope of the RF signal or signal envelope. Thus, when a voltage level of the signal envelope increases the voltage level of the power amplifier supply voltage can be increased. Likewise, when the voltage level of the signal envelope decreases the voltage level of the power amplifier supply voltage can be decreased to reduce power consumption.

There is a need for improved power amplifier systems. Furthermore, there is a need for improved envelope trackers.

SUMMARY

In certain embodiments, the present disclosure relates to a method of envelope tracking in a power amplifier system. The method includes generating a regulated voltage from a battery voltage using a DC-to-DC converter, generating a first envelope current based on a first digital envelope signal, providing the first envelope current as an input to a first error amplifier, the first error amplifier electrically connected with negative feedback, and generating a first power amplifier supply voltage by combining the regulated voltage from the DC-to-DC converter and an output of the first error amplifier using a first AC combiner.

In some embodiments, the method further includes generating an error current using the first error amplifier, and generating the regulated voltage based on the error current.

In various embodiments, generating the first envelope current based on the first digital envelope signal includes level-shifting a plurality of bits of the first digital envelope signal using a plurality of level-shifters, providing the plurality of level-shifted bits to a plurality of resistors, and generating the first envelope current based on a flow of current through the plurality of resistors.

In a number of embodiments, the method includes generating a second envelope current based on a second digital envelope signal, controlling an output of a second error amplifier based on the second envelope current, the second error amplifier electrically connected with negative feedback, and generating a second power amplifier supply voltage by combining the regulated voltage from the DC-to-DC converter and the output of the second error amplifier using a second AC combiner.

According to certain embodiments, the method further includes generating a first error current using the first error amplifier, generating a second error current using the second error amplifier, generating a combined error current based on the first and second error currents, and generating the regulated voltage based on the combined error current. In various embodiments, generating the combined error current includes averaging the first and second error currents. In several embodiments, the method further includes powering a first power amplifier using the first power amplifier supply voltage and powering a second power amplifier using the second power amplifier supply voltage.

In some embodiments, the method further includes tracking a high frequency component of the first digital envelope signal using the first error amplifier and tracking a low frequency component of the first digital envelope signal using the DC-to-DC converter.

In certain embodiments, the present disclosure relates to an envelope tracking system. The envelope tracking system includes a DC-to-DC converter configured to generate a regulated voltage from a battery voltage, the DC-to-DC converter including an output that provides the regulated voltage. The envelope tracking system further includes a first current digital to analog converter (DAC) configured to receive a first digital envelope signal, the first current DAC configured to generate a first envelope current based on the first digital envelope signal. The envelope tracking system further includes a first feedback circuit and a first error amplifier including an output and an inverting input electrically connected to one another via the first feedback circuit, the output of the first error amplifier configured to change based on the first envelope current. The envelope tracking system further includes a first AC combiner configured to generate a first power amplifier supply voltage based on combining the output of first error amplifier and the output of the DC-to-DC converter.

In some embodiments, the first error amplifier is further configured to generate an error current, and the DC-to-DC converter is further configured to generate the regulated voltage based on the error current.

In various embodiments, the first error amplifier further includes a non-inverting input electrically connected to a first reference voltage, and the first current DAC is configured to provide the first envelope current to the inverting input of the first error amplifier.

In several embodiments, the first feedback circuit includes a resistor and a capacitor electrically connected in parallel.

In a number of embodiments, the first AC combiner includes an inductor electrically connected between the output of the DC-to-DC converter and the first power amplifier supply voltage, and a capacitor electrically connected between the output of the first error amplifier and the first power amplifier supply voltage.

According to various embodiments, the first current DAC includes a plurality of level-shifters and a plurality of resistors, and the plurality of level-shifters are configured to generate a plurality of level-shifted bits by level-shifting a plurality of bits of the first digital envelope signal and to provide the plurality of level-shifted bits to the plurality of resistors.

In some embodiments, the envelope tracking system further includes a second current DAC, a second error amplifier, and a second AC combiner. The second current DAC is configured to receive a second digital envelope signal and to generate a second envelope current based on the second digital envelope signal. The second error amplifier includes an output and an inverting input electrically connected to one another via a second feedback circuit, and the output of the second error amplifier is configured to change based on the second envelope current. The second AC combiner is configured to generate a second power amplifier supply voltage based on combining the output of second error amplifier and the output of the DC-to-DC converter.

In several embodiments, the envelope tracking system further includes an error current processing circuit configured to generate a combined error current based on a first error current from the first error amplifier and a second error current from the second amplifier, and the DC-to-DC converter is further configured to generate the regulated voltage based on the combined error current.

In certain embodiments, the present disclosure relates to a wireless device. The wireless device includes a transceiver configured to generate a first digital envelope signal and a first radio frequency signal, a first power amplifier configured to amplify the first radio frequency signal, and an envelope tracker configured to receive the first digital envelope signal and to generate a first power amplifier supply voltage for the first power amplifier. The envelope tracker includes a DC-to-DC converter, a first error amplifier, and a first AC combiner, and the first AC combiner is configured to generate the first power amplifier supply voltage based on combining an output of the DC-to-DC converter and an output of the first error amplifier.

In some embodiments, the wireless device further a second power amplifier configured to amplify a second radio frequency signal from the transceiver, and the envelope tracker is further configured to receive a second digital envelope signal from the transceiver and to generate a second power amplifier supply voltage for the second power amplifier.

In various embodiments, the envelope tracker further includes a second error amplifier and a second AC combiner. The second AC combiner is configured to generate the second power amplifier supply voltage based on combining the output of the DC-to-DC converter and an output of the second error amplifier.

In several embodiments, the first radio frequency signal is a low band signal and the second radio frequency signal is a high band signal.

DETAILED DESCRIPTION OF EMBODIMENTS

Figure 1:
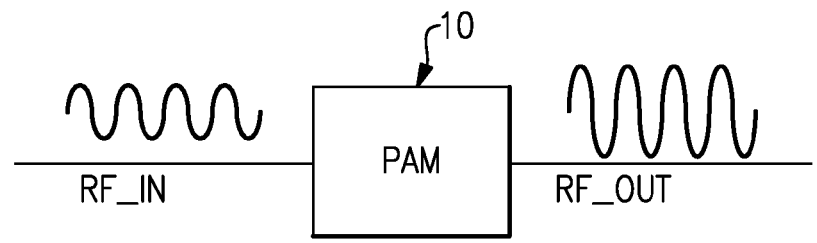
FIG. 1 is a schematic diagram of a power amplifier module for amplifying a radio frequency (RF) signal.

The headings provided herein, if any, are for convenience only and do not necessarily affect the scope or meaning of the claimed invention.

The demand for higher data rates in mobile communication devices has created technical challenges for power amplifier systems. For example, certain mobile devices operate using carrier aggregation in which the mobile device communicates across multiple carriers, which can be in the same frequency band or in different frequency bands. Although carrier aggregation can increase bandwidth, carrier aggregation can have relatively stringent power amplifier linearity specifications. Furthermore, certain mobile devices can operate over a wide range of frequencies, including high frequency bands in which power amplifiers may exhibit relatively poor linearity.

Such technical challenges can be exacerbated by a desire to reduce a power amplifier system's cost by manufacturing power amplifier circuitry using complementary metal oxide semiconductor (CMOS) processing rather than III-V semiconductor processing, which typically can be more costly. However, manufacturing a power amplifier using CMOS processing may provide poor power amplifier linearity.

In certain configurations herein, a power amplifier system includes one or more power amplifiers and an envelope tracker, which generates one or more power amplifier supply voltages for the power amplifiers. The envelope tracker can control a power supply voltage of a particular power amplifier such that a voltage level of the power supply voltage changes in relation to an envelope of an RF signal amplified by the power amplifier.

Using envelope tracking can provide enhanced power performance relative to a configuration using a power supply voltage that has a constant voltage level. Additionally, envelope tracking can also improve the linearity of the power amplifier system by controlling the power amplifier's output voltage in relation to the envelope signal. For instance, since the envelope tracker changes a voltage level of the power amplifier output based on a low frequency component of the RF signal, the envelope tracker can improve the linearity of the power amplifier by changing the voltage of the power amplifier output at the envelope frequency.

In certain configurations herein, an envelope tracker includes a DC-to-DC converter, a current digital-to-analog converter (DAC), an error amplifier, a feedback circuit, and an AC combiner. Additionally, the current DAC receives a digital envelope signal, and uses the digital envelope signal to generate an envelope current. The feedback circuit is electrically connected between an output and an inverting input of the error amplifier, and the envelope current is provided to the error amplifier's inverting input. Additionally, the AC combiner generates a power amplifier supply voltage by combining an output of the DC-to-DC converter and an output of the error amplifier. In certain implementations, the error amplifier also generates an error current that is provided to the DC-to-DC converter to aid the DC-to-DC converter in tracking a low frequency component of the digital envelope signal.

Using a digital envelope signal can achieve a wide variety of advantages relative to a system using an analog envelope signal. For example, changes to the digital envelope signal can be self-aligned, which can provide enhanced performance relative to an envelope tracker operating using an analog envelope signal. For example, different frequency components of an analog envelope signal may have different group delays, which can lead to a loss of high frequency envelope information and/or a degradation of bandwidth and/or linearity.

Additionally, in certain configurations, the digital envelope signal can be processed using digital signal processing (DSP) techniques to achieve high linearity and efficiency, which can enhance performance and/or permit the use of CMOS processing technologies for power amplification. The envelope tracker can be used in a wide variety of power amplifier systems, including power amplifier systems that use carrier aggregation to achieve high data rates.

In certain configurations, the envelope tracker can further include one or more additional current DACs, one or more additional error amplifiers, one or more additional feedback circuits, and one or more AC combiners that can operate in conjunction with the DC-to-DC converter to generate additional power amplifier supply voltages. Thus, the envelope tracker can generate supply voltages for two or more power amplifiers using a common or shared DC-to-DC converter.

FIG. 1 is a schematic diagram of a power amplifier module (PAM) 10 for amplifying a radio frequency (RF) signal. The illustrated power amplifier module 10 amplifies an RF signal (RF_IN) to generate an amplified RF signal (RF_OUT). As described herein, the power amplifier module 10 can include one or more power amplifiers.

Figure 2:
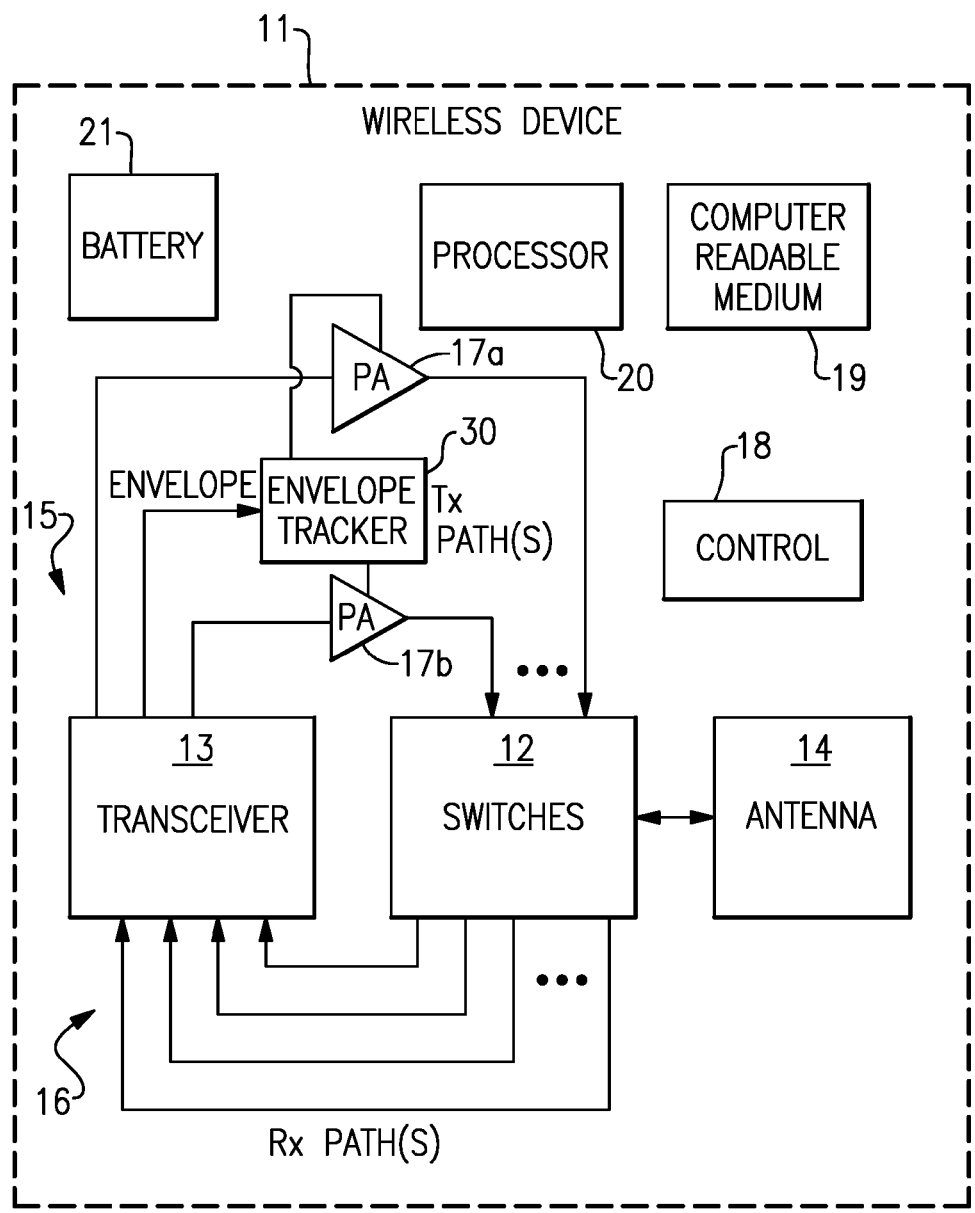
FIG. 2 is a schematic diagram of an example wireless device that can include one or more of the power amplifier modules of FIG. 1.

FIG. 2 is a schematic block diagram of an example wireless or mobile device 11 that can include one or more of the power amplifier modules 10 of FIG. 1. The wireless device 11 can also include an envelope tracking system implementing using one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more radio frequency spectrum bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64 QAM signals.

In certain embodiments, the wireless device 11 can include switches 12, a transceiver 13, an antenna 14, power amplifiers 17a, 17b, a control component 18, a computer readable medium 19, a processor 20, a battery 21, and an envelope tracker 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can operate using different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands. Although FIG. 2 illustrates a configuration using two transmission paths 15 and two power amplifiers 17a, 17b, the wireless device 11 can be adapted to include more or fewer transmission paths 15 and/or more or fewer power amplifiers.

In FIG. 2, one or more detected signals from the antenna 14 are depicted as being provided to the transceiver 13 via one or more receiving paths 16. In the example shown, different receiving paths 16 can represent paths associated with different bands. For example, the four example receiving paths 16 shown can represent quad-band capability that some wireless devices are provided with. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17a, 17b, the envelope tracker 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The illustrated wireless device 11 also includes the envelope tracker 30, which can be used to provide power amplifier supply voltages to one or more of the power amplifiers 17a, 17b. For example, the envelope tracker 30 can be configured to change the supply voltages provided to the power amplifiers 17a, 17b based upon an envelope of the RF signal to be amplified. In the illustrated implementation, the envelope signal is provided to the envelope tracker 30 from the transceiver 13. However, other implementations are possible, including, for example, configurations in which the envelope signal is provided to the envelope tracker 30 from a baseband processor or a power management integrated circuit (PMIC). Furthermore, in certain implementations, the envelope signal can be generated from the RF signal by detecting the RF signal's envelope using any suitable envelope detector.

The envelope tracker 30 can be electrically connected to the battery 21, which can be any suitable battery for use in the wireless device 11, including, for example, a lithium-ion battery. As will be described in detail further below, by controlling the voltage provided to one or more of the power amplifiers 17a, 17b, the power consumed from the battery 21 can be reduced, thereby improving the battery life of the wireless device 11. In certain configurations, the power amplifiers 17a, 17b can be implemented using CMOS processing, which can lower cost and/or enhance integration. However, other configurations of the power amplifiers 17a, 17b are possible. For example, the power amplifiers 17a, 17b can be implemented using III-V semiconductor processing, such as Gallium Arsenide (GaAs) processing.

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Figure 3:
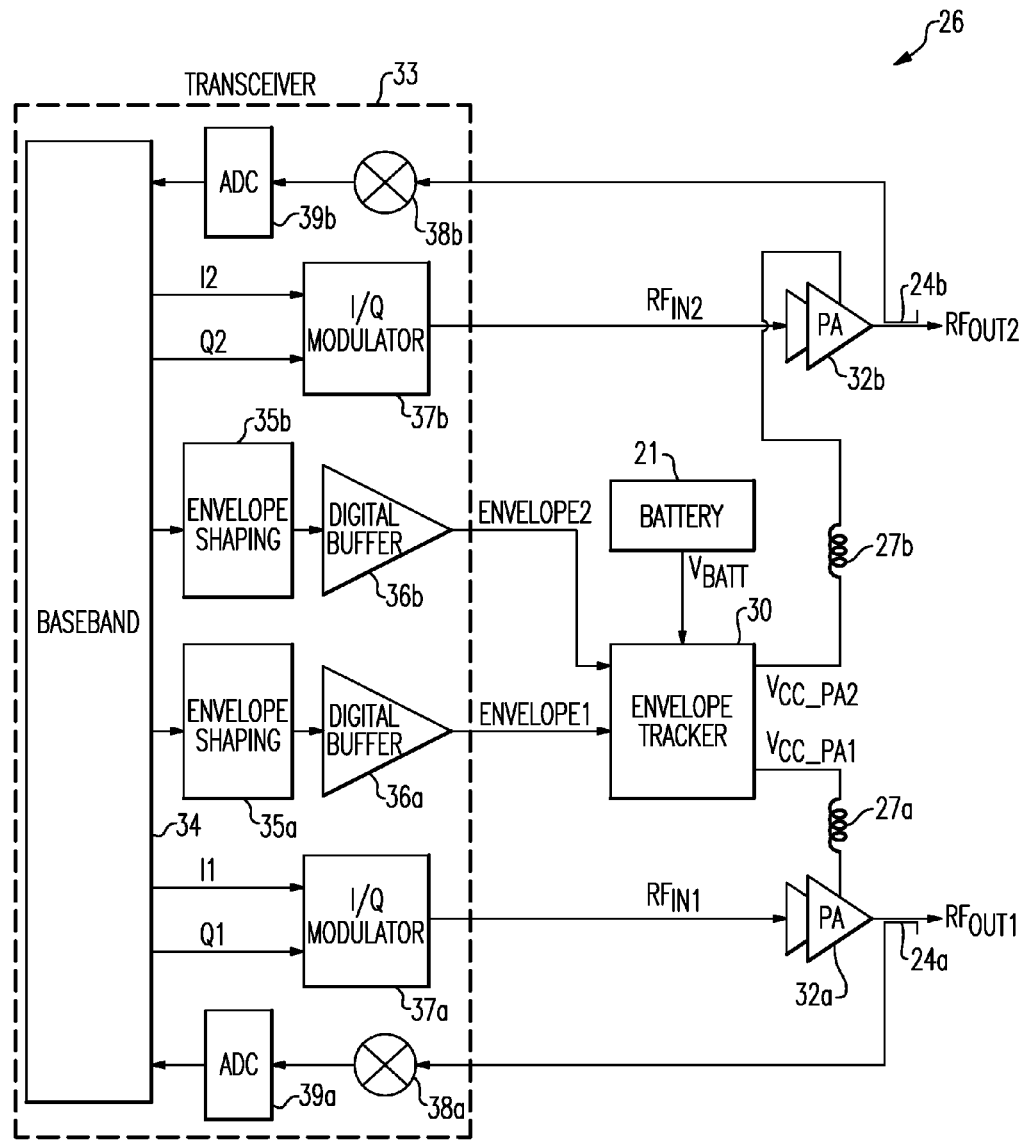
FIG. 3 is a schematic diagram of one embodiment of a power amplifier system including an envelope tracker.

FIG. 3 is a schematic diagram of one embodiment of a power amplifier system 26 including an envelope tracker 30. The illustrated power amplifier system 26 includes the battery 21, a first directional coupler 24a, a second directional coupler 24b, a first inductor 27a, a second inductor 27b, the envelope tracker 30, a first power amplifier 32a, a second power amplifier 32b, and a transceiver 33. The illustrated transceiver 33 includes a baseband processor 34, a first envelope shaping block 35a, a second envelope shaping block 35b, a first digital buffer 36a, a second digital buffer 36b, a first I/Q modulator 37a, a second I/Q modulator 37b, a first mixer 38a, a second mixer 38b, a first analog-to-digital converter (ADC) 39a, and a second ADC 39b.

Although the power amplifier system 26 illustrates a configuration including two power amplifiers, the power amplifier system 26 can be adapted to include more or fewer power amplifiers.

The baseband processor 34 generates a first in-phase signal I1 and a first quadrature-phase signal Q1, which correspond to signal components of a first sinusoidal wave or signal of a desired amplitude, frequency, and phase. For example, the first in-phase signal I1 can be used to represent an in-phase component of the first sinusoidal wave and the first quadrature-phase signal Q1 can be used to represent a quadrature component of the first sinusoidal wave, which can be an equivalent representation of the first sinusoidal wave. Additionally, the illustrated baseband processor 34 further generates a second in-phase signal I2 and a second quadrature-phase signal Q2, which correspond to signal components of a second sinusoidal wave.

The first I/Q modulator 37a receives the first in-phase signal I1 and the first quadrature-phase signal Q1, which can be in a digital format. Similarly, the second I/Q modulator 37b receives the second in-phase signal I2 and the second quadrature-phase signal Q2, which can be in a digital format. The baseband processor 34 can be any suitable processor configured to process baseband signals. For instance, the baseband processor 34 can include a digital signal processor, a microprocessor, a programmable core, or any combination thereof. Moreover, in some implementations, two or more baseband processors 34 can be included in the power amplifier system 26.

The first I/Q modulator 37a can process the first in-phase signal I1 and the first quadrature-phase signal Q1 to generate a first RF signal $RF_{IN1}$ for amplification by the first power amplifier 32a. For example, the first I/Q modulator 37a can include DACs configured to convert the first in-phase signal I1 and the first quadrature-phase signal Q1 into an analog format, mixers for upconverting the analog I and Q signals to radio frequency, and a signal combiner for combining the upconverted I and Q signals into an RF signal suitable for amplification by the first power amplifier 32a. In certain implementations, the first I/Q modulator 37a can include one or more filters configured to filter frequency content of signals processed therein. Similarly, the second I/Q modulator 37b can process the second in-phase signal I2 and the second quadrature-phase signal Q2 to generate a second RF signal $RF_{IN2}$ for amplification by the second power amplifier 32b.

The first envelope shaping block 35a can be used to convert envelope or amplitude data associated with the first in-phase signal I1 and first quadrature-phase signal Q1 into shaped envelope data. Similarly, the second envelope shaping block 35b can be used to convert envelope or amplitude data associated with the second in-phase signal I2 and second quadrature-phase signal Q2 into shaped envelope data. Shaping the envelope data from the baseband processor 34 can aid in enhancing performance of the power amplifier system 26 by, for example, adjusting the envelope signal to optimize linearity of the power amplifiers 32a, 32b and/or to achieve a desired gain and phase response of the power amplifiers 32a, 32b.

The first digital buffer 36a receives the shaped envelope data from the first envelope shaping block 35a and generates a first digital envelope signal (ENVELOPE1) for the envelope tracker 30. Additionally, the second digital buffer 36b receives the shaped envelope data from the second envelope shaping block 35b and generates a second digital envelope signal (ENVELOPE2) for the envelope tracker 30. In one embodiment, the first and second digital envelope signals correspond to digital linear pulse-code modulation (LPCM) signals. However, other configurations are possible.

Using digital envelope signals in a power amplifier system can achieve a wide variety of advantages relative to a configuration using analog envelope signals. For example, changes to the digital envelope signals can be self-aligned. In contrast, different frequency components of an analog envelope signal may have different group delays, which can lead to high frequency envelope loss and/or bandwidth degradation.

The envelope tracker 30 can receive the first and second digital envelope signals from the transceiver 33 and a battery voltage $V_{BATT}$ from the battery 21. Additionally, the envelope tracker 30 can use the first digital envelope signal to generate a first power amplifier supply voltage $V_{CC\_PA1}$ for the first power amplifier 32a that changes in relation to the first digital envelope signal (ENVELOPE1). Furthermore, the envelope tracker 30 can use the second digital envelope signal to generate a second power amplifier supply voltage $V_{CC\_PA2}$ for the second power amplifier 32b that changes in relation to the second digital envelope signal (ENVELOPE2).

The first power amplifier 32a can receive the first RF input signal $RF_{IN1}$ from the first I/Q modulator 37a of the transceiver 33, and can generate a first RF output signal $RF_{OUT1}$, which can be provided to, for example, an antenna via switches. The second power amplifier 32b can receive the second RF input signal $RF_{IN2}$ from the second I/Q modulator 37b of the transceiver 33, and can generate a second RF output signal $RF_{OUT2}$. In one embodiment, the first power amplifier 32a and the second power amplifier 32b provide amplification to RF signals in different frequency bands.

The first directional coupler 24a can be positioned at the output of the first power amplifier 32a. Additionally, the sensed output signal from the first directional coupler 24a can be provided to the first mixer 38a, which can multiply the sensed output signal by a reference signal of a controlled frequency so as to downshift the frequency spectrum of the sensed output signal. The downshifted signal from the first mixer 38a can be provided to the first ADC 39a, which can convert the downshifted signal to a digital format suitable for processing by the baseband processor 34. By including a feedback path between the output of the first power amplifier 32a and an input of the baseband processor 34, the baseband processor 34 can dynamically adjust the first in-phase signal I1 and the first quadrature-phase signal Q1 and/or envelope data associated with the first in-phase signal I1 and the first quadrature-phase signal Q1 to optimize the operation of the power amplifier system 26. For example, configuring the power amplifier system 26 in this manner can aid in controlling the power added efficiency (PAE) and/or linearity of the first power amplifier 32a.

Similarly, the second directional coupler 24b can be positioned at the output of the second power amplifier 32b. Additionally, the sensed output signal from the second directional coupler 24b can be provided to the second mixer 38b, which can multiply the sensed output signal by a reference signal of a controlled frequency so as to downshift the frequency spectrum of the sensed output signal. The downshifted signal from the second mixer 38b can be provided to the second ADC 39b, which can convert the downshifted signal to a digital format suitable for processing by the baseband processor 34.

The power amplifier system 26 can represent a wide variety of power amplifier systems, including, for example, multi-mode power amplifier systems, multi-mode power amplifier systems, and/or power amplifier systems that can employ carrier aggregation.

As shown in FIG. 3, the first power amplifier 32a receives the first power amplifier supply voltage $V_{CC\_PA1}$ through the first inductor 27a, and the second power amplifier 32b receives the second power amplifier supply voltage $V_{CC\_PA2}$ through the second inductor 27b. The first and second inductors 27a, 27b can aid in powering the power amplifiers 32a, 32b while choking or blocking high frequency RF signal components from reaching the envelope tracker 30. In certain configurations, the first and second inductors 27a, 27b operate in output matching networks of the power amplifiers to aid in providing output impedance matching.

Figure 4A:
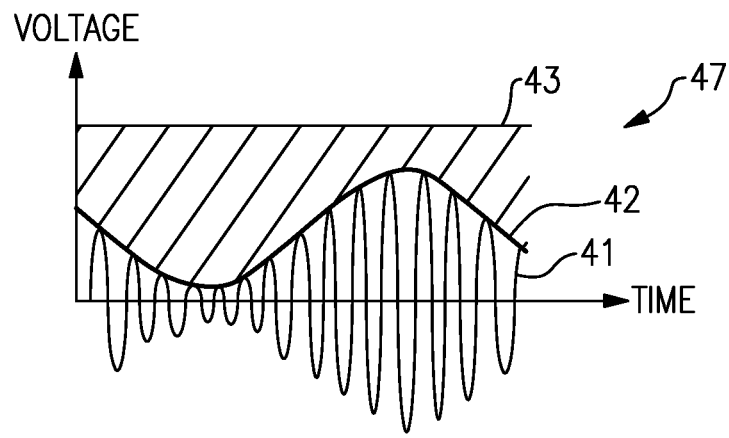
FIGS. 4A-4B show two examples of power amplifier supply voltage versus time.
Figure 4B:
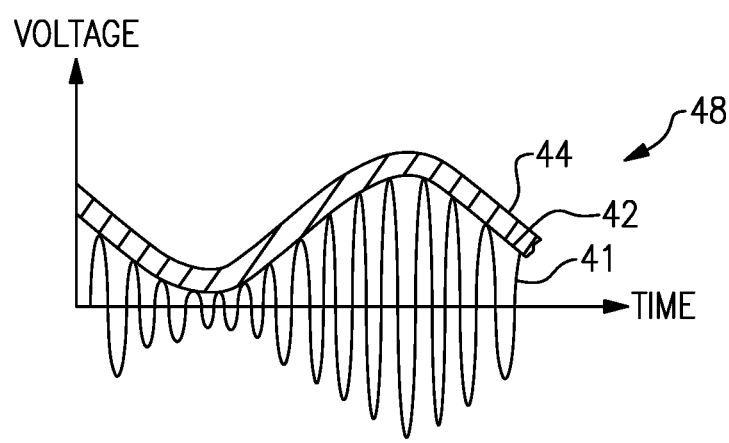

FIGS. 4A-4B show two examples of power amplifier supply voltage versus time.

In FIG. 4A, a graph 47 illustrates one example of the voltage of an RF signal 41 and a power amplifier supply voltage 43 versus time. The RF signal 41 has an envelope 42.

It can be important that the power amplifier supply voltage 43 of a power amplifier has a voltage greater than that of the RF signal 41. For example, powering a power amplifier using a power amplifier supply voltage that has a magnitude less than that of the RF signal can clip the RF signal, thereby creating signal distortion and/or otherwise degrading signal integrity. Thus, it can be important the power amplifier supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a wireless device.

In FIG. 4B, a graph 48 illustrates another example of the voltage of an RF signal 41 and a power amplifier supply voltage 44 versus time. In contrast to the power amplifier supply voltage 43 of FIG. 4A, the power amplifier supply voltage 44 of FIG. 4B changes in relation to the envelope 42 of the RF signal 41. The area between the power amplifier supply voltage 44 and the envelope 42 in FIG. 4B is less than the area between the power amplifier supply voltage 43 and the envelope 42 in FIG. 4A, and thus the graph 48 of FIG. 4B can be associated with a power amplifier system having greater energy efficiency.

Apparatus and methods for wideband envelope tracking are disclosed herein. In certain configurations, an envelope tracker is provided for generating one or more power amplifier supply voltages for one or more power amplifiers. The envelope tracker includes a DC-to-DC converter, a current digital-to-analog converter (DAC), an error amplifier, a feedback circuit, and an AC combiner. The current DAC receives a digital envelope signal, and uses the digital envelope signal to generate an envelope current. The feedback circuit is connected between an output and an inverting input of the error amplifier, and the envelope current is provided to the error amplifier's inverting input. Additionally, the AC combiner generates a power amplifier supply voltage for a first power amplifier by combining an output of the DC-to-DC converter and an output of the error amplifier.

In configurations in which the envelope tracker generates power supply voltages for two or more power amplifiers, the envelope tracker can further include one or more additional current DACs, one or more additional error amplifiers, one or more additional feedback circuits, and one or more AC combiners that can operate in conjunction with the DC-to-DC converter to generate additional power amplifier supply voltages. Thus, the envelope tracker can generate supply voltages for two or more power amplifiers using a common or shared DC-to-DC converter.

In certain implementations, the DC-to-DC converter can receive an error current that can aid the DC-to-DC converter in tracking low frequency component envelope signal components. In certain configurations, one or more error amplifiers can generate one or more error currents that can be processed to generate the error current for the DC-to-DC current.

The envelope trackers herein can receive envelope information via one or more digital envelope signals. Using a digital envelope signal can achieve numerous advantages relative to receiving envelope information via an analog envelope signal. For example, changes to the digital envelope signal can be self-aligned. In contrast, different frequency components of an analog envelope signal may have different group delays, which can lead to a loss of high frequency envelope information and/or a degradation of bandwidth. By using digital envelope signals, the envelope tracker system can have a bandwidth sufficient to provide envelope tracking in power amplifier systems operating with carrier aggregation, including non-contiguous carrier aggregation associated with carriers in high and low frequency bands.

Additionally, in certain configurations, the digital envelope signal can be processed using digital signal processing (DSP) techniques to achieve high linearity and efficiency, which can enhance performance and/or permit the use of CMOS processing technologies for power amplification.

Figure 5:
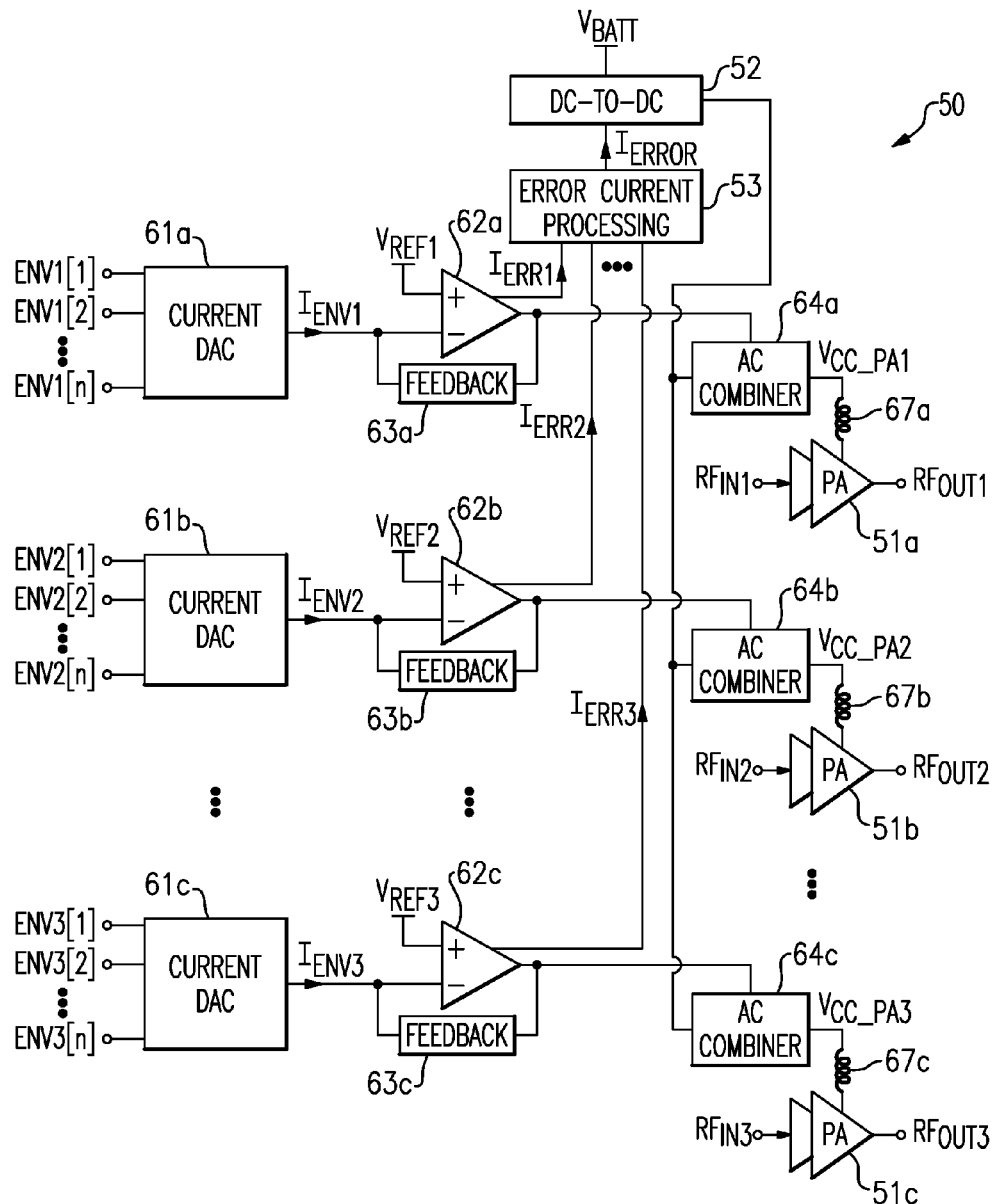
FIG. 5 is a schematic block diagram of one embodiment of an envelope tracking system.

FIG. 5 is a schematic block diagram of one embodiment of an envelope tracking system 50. The envelope tracking system 50 includes a first power amplifier 51*a*, a second power amplifier 51*b*, a third power amplifier 51*c*, a DC-to-DC converter 52, an error current processing circuit 53, a first current digital-to-analog converter (DAC) 61*a*, a second current DAC 61*b*, a third current DAC 61*c*, a first error amplifier 62*a*, a second error amplifier 62*b*, a third error amplifier 62*c*, a first feedback circuit 63*a*, a second feedback circuit 63*b*, a third feedback circuit 63*c*, a first AC combiner 64*a*, a second AC combiner 64*b*, a third AC combiner 64*c*, a first inductor 67*a*, a second inductor 67*b*, and a third inductor 67*c*.

Although the illustrated envelope tracking system 50 generates power supply voltages for three power amplifiers, the envelope tracking system 50 can be adapted to generate power supply voltages for more or fewer power amplifiers.

As shown in FIG. 5, the DC-to-DC converter 52 receives a battery voltage $V_{BATT}$ from a battery, such as the battery 21 of FIGS. 2 and 3. The DC-to-DC converter 52 can be used to convert the battery voltage $V_{BATT}$ into a regulated or output voltage. The DC-to-DC converter 52 can be implemented in a variety of ways. In one embodiment, the DC-to-DC converter includes a buck converter which generates a buck voltage that is less that the battery voltage $V_{BATT}$. In another embodiment, the DC-to-DC converter 52 includes a booster converter that generates a boost voltage that is greater that the battery voltage $V_{BATT}$. As shown in FIG. 5, the output voltage of the DC-to-DC converter 52 is provided as an input to the first AC combiner 64*a*, the second AC combiner 64*b*, and the third AC combiner 64*c*.

In the illustrated configuration, the DC-to-DC converter 52 also receives a combined or processed error current $I_{ERROR}$, which can be used to track low frequency envelope signal components, as will be described further below.

The first current DAC 61*a* receives a first digital envelope signal ENV1, which includes n bits. In one embodiment, n is selected to be in the range of 2 bits to 8 bits. The first current DAC 61*a* can be used to generate a first envelope current $I_{ENV1}$ that has a magnitude that can change based on a value of the first digital envelope signal ENV1.

As shown in FIG. 5, the second current DAC 61*b* receives a second digital envelope signal ENV2 and generates a second envelope current $I_{ENV2}$. Additionally, the third current DAC 61*c* receives a third digital envelope signal ENV3 and generates a third envelope current $I_{ENV3}$.

Although FIG. 5 illustrates a configuration in which each of the digital envelope signals ENV1-ENV3 include n bits, the teachings herein are also applicable to configurations in which two or more digital envelope signals includes a different number of bits relative to one another.

The first error amplifier 62*a* includes a non-inverting input, an inverting input, a first or voltage output, and a second or error current output. As shown in FIG. 5, the non-inverting input is electrically connected to a first reference voltage $V_{REF1}$. Additionally, the first feedback circuit 63*a* is electrically connected between the first output and the inverting input of the first error amplifier 62*a*. Furthermore the first error amplifier's inverting input receives the first envelope current $I_{ENV1}$, and the first error amplifier's error current output generates a first error current $I_{ERR1}$ for the error current processing circuit 53.

The second and third error amplifiers 62*b*, 62*c* are electrically connected in a manner similar to that of the first error amplifier 62*a*. For example, the second error amplifier 62*b* includes a non-inverting input electrically connected to a second reference voltage $V_{REF2}$, and an inverting input that receives the second envelope current $I_{ENV2}$. Additionally, the second feedback circuit 63*b* is electrically connected between a voltage output and the inverting input of the second error amplifier 62*b*. The second error amplifier 62*b* further includes an error current output that generates a second error current $I_{ERR2}$ for the error current processing circuit 53. The third error amplifier 62*c* includes a non-inverting input electrically connected to a third reference voltage $V_{REF3}$, and an inverting input that receives the third envelope current $I_{ENV3}$. Additionally, the third feedback circuit 63*c* is electrically connected between a voltage output and the inverting input of the third error amplifier 62*c*. The third error amplifier 62*c* further includes an error current output that generates a third error current $I_{ERR3}$ for the error current processing circuit 53.

The first to third feedback circuits 63*a*-63*c* can be any suitable circuits, and can include active and/or passive circuitry. In one implementation, a feedback circuit includes a resistor electrically connected between the feedback circuit's terminals. However, other implementations of feedback circuits are possible.

In the configuration shown in FIG. 5, the error current processing circuit 53 processes error currents from each of the error amplifiers 62*a*-62*c* to generate a combined error current $I_{ERROR}$. Additionally, the error current processing circuit 53 provides the combined error current $I_{ERROR}$ to the DC-to-DC converter 52 to aid DC-to-DC converter 52 in performing envelope tracking.

The first AC combiner circuit 64*a* generates a first power amplifier supply voltage $V_{CC\_PA1}$ based on combining the first output of the first error amplifier 62*a* and the output of the DC-to-DC converter 52. Similarly, the second AC combiner circuit 64b generates a second power amplifier supply voltage $V_{CC\_PA2}$ based on combining the first output of the second error amplifier 62b and the output of the DC-to-DC converter 52. Likewise, the third AC combiner circuit 64c generates a third power amplifier supply voltage $V_{CC\_PA3}$ based on combining the first output of the third error amplifier 62c and the output of the DC-to-DC converter 52.

The illustrated power amplifier system 50 includes the error amplifiers 62a-62c, which operate in conjunction with a common or shared DC-to-DC converter 52 to control the voltages levels of power amplifier supply voltages of the first to third power amplifiers 51a-51c.

The DC-to-DC converter 52 can have a power efficiency that is greater than the power efficiency of the error amplifiers 62a-62c, but a tracking speed that is slower than that of the error amplifiers. In the illustrated configuration, the error amplifiers 62a-62c provide tracking of high frequency components of the envelope signals ENV1-ENV3 while the DC-to-DC converter 52 provides tracking of low frequency components of the digital envelope signals.

For example, the first error amplifier 62a generates a first error current $I_{ERR1}$, which can be based on a voltage difference between the first error amplifier's non-inverting input and inverting input and can indicate a difference between a present voltage level of the first power amplifier supply voltage $V_{CC\_PA1}$ and a desired voltage level of the first power amplifier supply voltage $V_{CC\_PA1}$. Similarly, the second error amplifier 62b generates a second error current $I_{ERR2}$, which can indicate a difference between a present voltage level of the second power amplifier supply voltage $V_{CC\_PA2}$ and a desired voltage level of the second power amplifier supply voltage $V_{CC\_PA2}$. Likewise, the third error amplifier 62c generates a third error current $I_{ERR3}$, which can indicate a difference between a present voltage level of the third power amplifier supply voltage $V_{CC\_PA3}$ and a desired voltage level of the third power amplifier supply voltage $V_{CC\_PA3}$.

Additionally, the error current processing circuit 53 can process the first to third error currents $I_{ERR1}$-$I_{ERR3}$ to generate the combined error current $I_{ERROR}$ for the DC-to-DC converter 52. In one embodiment, the error current processing circuit 53 averages the first to third error currents $I_{ERR1}$-$I_{ERR3}$ to generate the combined error current $I_{ERROR}$. However, other configurations are possible.

The combined error current $I_{ERROR}$ can change as the first to third error amplifiers 62a-62c sink or source current onto the first to third power amplifier supply voltages $V_{CC\_PA1}$-$V_{CC\_PA3}$, respectively. Additionally, the output voltage of the DC-to-DC converter 52 can be controlled over time so as to reduce the magnitude of the combined error current $I_{ERROR}$. Thus, the error amplifiers 62a-62c can be used to track high frequency components of the digital envelope signals ENV1-ENV3, while the DC-to-DC converter 52 can track low frequency components of the digital envelope signals ENV1-ENV3.

The envelope tracking system 50 can provide precise envelope tracking while providing high power efficiency. For example, the error amplifiers 62a-62c can each have a power efficiency that is less than that of the DC-to-DC converter 52, but a tracking speed that is faster than a tracking speed of the DC-to-DC converter 52. Thus, the illustrated envelope tracking system 50 can exhibit high overall power efficiency.

Additionally, the envelope tracking system 50 can have a relatively small component count, including, for example, a relatively small number of external components such as discrete inductors.

As shown in FIG. 5, the first power amplifier 51a receives a first RF input signal $RF_{IN1}$ and generates a first RF output signal $RF_{OUT1}$. Additionally, the first power amplifier 51a receives the first power amplifier supply voltage $V_{CC\_PA1}$ via the first inductor 67a. Similarly, the second power amplifier 51b receives a second RF input signal $RF_{IN2}$ and generates a second RF output signal $RF_{OUT2}$. Additionally, the second power amplifier 51b receives the second power amplifier supply voltage $V_{CC\_PA2}$ via the second inductor 67b. Likewise, the third power amplifier 51c receives a third RF input signal $RF_{IN3}$ and generates a third RF output signal $RF_{OUT3}$. Additionally, the third power amplifier 51c receives the third power amplifier supply voltage $V_{CC\_PA1}$ via the third inductor 67c.

The first to third inductors 67a-67c can aid in providing power to the first to third power amplifiers 51a-51c, respectively, while choking or blocking high frequency RF signal components. Additionally, in certain configurations, the first to third inductors 67a-67c can be used in part to provide power amplifier output matching.

In one embodiment, at least two of the power amplifiers 51a-51c provide amplification to RF signals associated with different frequency bands. The illustrated configuration, illustrates one embodiment of an envelope tracking system suitable for use in a wireless device that communicates using carrier aggregation.

Figure 6:
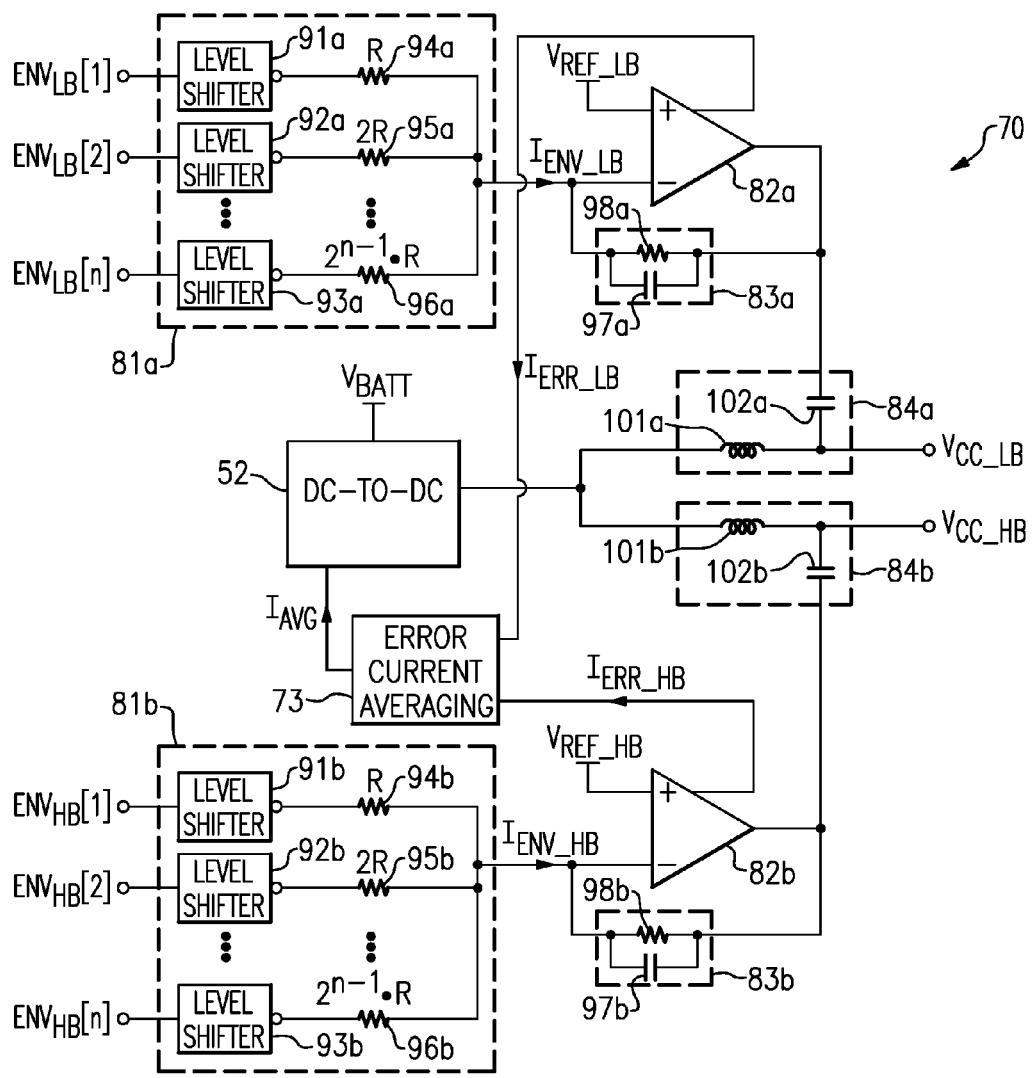
FIG. 6 is a schematic block diagram of another embodiment of an envelope tracking system.

FIG. 6 is a schematic block diagram of another embodiment of an envelope tracking system 70. The envelope tracking system 70 includes a DC-to-DC converter 52, an error current averaging circuit 73, a first current DAC 81a, a second current DAC 81b, a first error amplifier 82a, a second error amplifier 82b, a first feedback circuit 83a, a second feedback circuit 83b, a first AC combiner 84a, and a second AC combiner 84b.

The first current DAC 81a receives a low band digital envelope signal $ENV_{LB}$ including a plurality of bits and generates a low band envelope current $I_{ENV\_LB}$. The first current DAC 81a includes a first low band level shifter 91a that levels shifts a first bit of the low band digital envelope signal $ENV_{LB}$ and provides a first low band level-shifted signal to a first low band resistor 94a. Additionally, the first current DAC 81a includes a second low band level shifter 92a that levels shifts a second bit of the low band digital envelope signal $ENV_{LB}$ and provides a second low band level-shifted signal to a second low band resistor 95a. Furthermore, the first current DAC 81a includes a third level shifter 93a that levels shifts a third bit of the low band digital envelope signal $ENV_{LB}$ and provides a third low band level-shifted signal to a third low band resistor 96a. As shown in FIG. 6, currents flowing through the low band resistors 94a, 95a, 96a are summed to generate the low band envelope current $I_{ENV\_LB}$.

Although FIG. 6 illustrates the first current DAC 81a as including circuitry associated with a 3-bit low band digital envelope signal $ENV_{LB}$, the first current DAC 81a can be adapted to process a digital envelope signal with more or fewer bits.

In certain configurations, the resistors 94a, 95a, 96a can be weighted relative to one another, such as by using a binary weighting scheme. However, other configurations are possible.

As shown in FIG. 6, the low band envelope current $I_{ENV\_LB}$ is provided to an inverting input of the first error amplifier 82a. In certain configurations, the low band level shifters 91a, 92a, 93a include inverting outputs used to provide inversion to aid in generating an envelope current of proper polarity for the first error amplifier 82a. However, other configurations are possible, such as configurations in which inversion is provided using logic gates (for example, inverters) or configurations in which a current DAC receives a logically inverted digital envelope signal.

The low band level shifters 91a, 92a, 93a can be used to level-shift the low band digital envelope signal $ENV_{LB}$ to a voltage domain of the envelope tracking system 70. Additionally, currents can flow from the low band level shifters 91a, 92a, 93a through the low band resistors 94a, 95a, 96a, which can have weights corresponding to bit-weights of the low band digital envelope signal $ENV_{LB}$. The currents through the low band resistors 94a, 95a, 96a can be summed to generate the low band envelope current $I_{ENV\_LB}$.

The second current DAC 81b receives a high band digital envelope signal $ENV_{HB}$ including a plurality of bits and generates a high band envelope current $I_{ENV\_HB}$ for the second error amplifier 82b. The second current DAC 81b includes a first high band level shifter 91b, a second high band level shifter 92b, a third high band level shifter 93b, a first high band resistor 94b, a second high band resistor 95b, and a third high band resistor 96b. Additional details of the second current DAC 81b can be similar to those of the first current DAC 81a.

The first feedback circuit 83a is electrically connected between an inverting input and a first output of the first error amplifier 82a. The first feedback circuit 83a includes a capacitor 97a and a resistor 98a electrically connected in parallel between the first feedback circuit's terminals. The first error amplifier 82a further includes a non-inverting input electrically connected to a low band reference voltage $V_{REF\_LB}$, and an error current output that generates a low band error current $I_{ERR\_LB}$.

The second feedback circuit 83b is electrically connected between an inverting input and a first output of the second error amplifier 82b. The second feedback circuit 83b includes a capacitor 97b and a resistor 98b electrically connected in parallel between the second feedback circuit's terminals. The second error amplifier 82b further includes a non-inverting input electrically connected to a high band reference voltage $V_{REF\_HB}$, and an error current output that generates a high band error current $I_{ERR\_HB}$.

As shown in FIG. 6, the error current averaging circuit 73 generates an averaged error current $I_{AVG}$, which is based on averaging the low band error current $I_{ERR\_LB}$ and the high band error current $I_{ERR\_HB}$. The DC-to-DC converter 52 generates an output voltage based on a battery voltage $V_{BATT}$ and the averaged error current $I_{AVG}$.

The first AC combiner 84a generates a low band power amplifier supply voltage $V_{CC\_LB}$ based on the output of the first error amplifier 82a and the output of the DC-to-DC converter 52. The first AC combiner 84a includes an inductor 101a electrically connected between the output of the DC-to-DC converter 52 and the low band power amplifier supply voltage $V_{CC\_LB}$, and a capacitor 102a electrically connected between the first output of the first error amplifier 82a and the low band power amplifier supply voltage $V_{CC\_LB}$. The capacitor 102a can aid in decoupling a voltage level at the first output of the first error amplifier 82a from the output voltage of the DC-to-DC converter 52, thereby permitting the first error amplifier 82a to control the first power amplifier supply voltage $V_{CC\_PA1}$ to relatively high voltage levels, including those above the battery voltage $V_{BATT}$.

The second AC combiner 84b generates a high band power amplifier supply voltage $V_{CC\_HB}$ based on the output of the second error amplifier 82b and the output of the DC-to-DC converter 52. The second AC combiner 84b includes an inductor 101b electrically connected between the output of the DC-to-DC converter 52 and the high band power amplifier supply voltage $V_{CC\_HB}$, and a capacitor 102b electrically connected between the first output of the second error amplifier 82b and the high band power amplifier supply voltage $V_{CC\_HB}$.

The illustrated envelope tracking system 70 can be used in a wireless device capable of communicating via carrier aggregation. For example, when operating using non-contiguous carrier aggregation, a low band power amplifier can be powered using the low band power amplifier supply voltage $V_{CC\_LB}$ and a high band power amplifier can be powered using the high band power amplifier supply voltage $V_{CC\_HB}$. Additionally, the low band power amplifier can amplify a first carrier in a low frequency band, and the high band power amplifier can amplify a second carrier in a high frequency band.

Additional details of the power amplifier system 70 can be similar to those described earlier.

Figure 7:
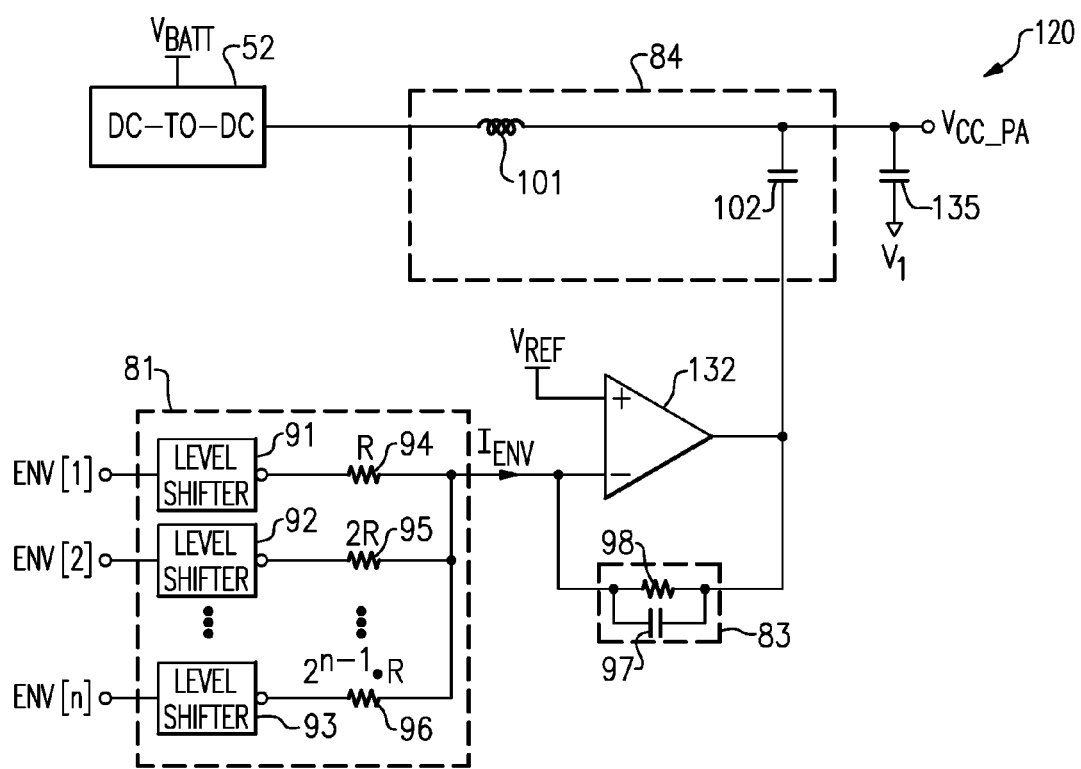
FIG. 7 is a schematic block diagram of another embodiment of an envelope tracking system.

FIG. 7 is a schematic block diagram of another embodiment of an envelope tracking system 120. The envelope tracking system 120 includes a DC-to-DC converter 52, a current DAC 81, a feedback circuit 83, an AC combiner 84, an error amplifier 132, and a bypass capacitor 135.

The current DAC 81 receives a digital envelope signal ENV and generates an envelope current $I_{ENV}$. The current DAC 81 includes a first level-shifter 91, a second level-shifter 92, a third level-shifter 93, a first resistor 94, a second resistor 95, and a third resistor 96. Additional details of the current DAC 81 can be similar to those described earlier.

The error amplifier 132 includes a non-inverting input electrically connected to a voltage reference $V_{REF}$ and an inverting input that receives the envelope current $I_{NV}$. The feedback circuit 83 is electrically connected between the error amplifier's inverting input and output, and includes a capacitor 97 and a resistor 98 electrically connected in parallel.

The AC combiner 84 includes an inductor 101 electrically connected between an output of the DC-to-DC converter 52 and the power amplifier supply voltage $V_{CC}$. The AC combiner 132 further includes a capacitor 102 electrically connected between the output of the error amplifier 132 and the power amplifier supply voltage $V_{CC}$.

The bypass capacitor 135 is electrically connected between the power amplifier supply voltage $V_{CC\_PA}$ and the power low supply voltage $V_1$, and can be included to reduce output supply noise.

Although not illustrated in FIG. 7, in certain configurations the DC-to-DC converter 52 can receive an error signal used to track changes in the digital envelope signal ENV. For example, the error signal can correspond to an error current generated by the error amplifier 132. However, the DC-to-DC converter can receive an error signals in other ways.

Additional details of the power amplifier system 120 can be similar to those described earlier.

Figure 8:
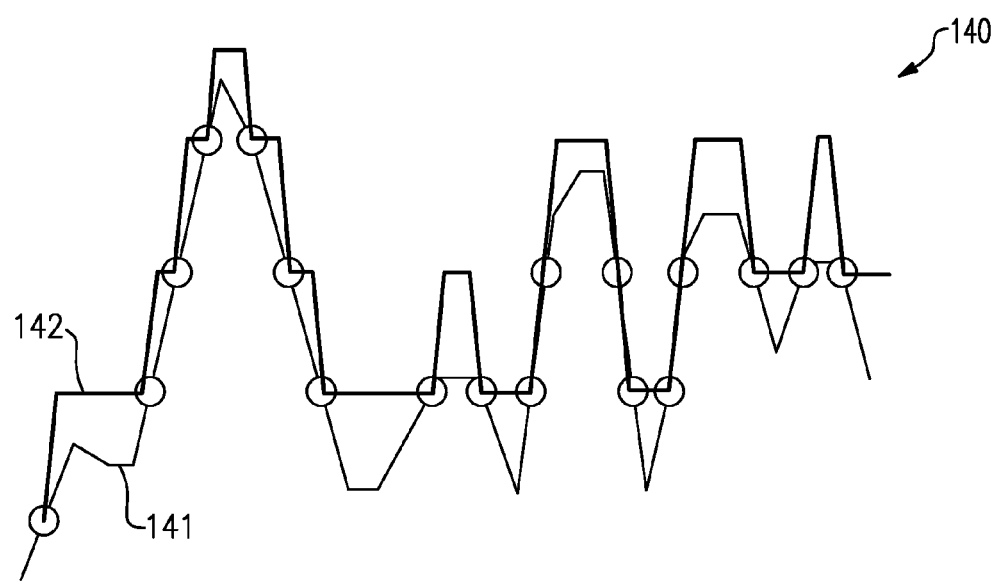
FIG. 8 is a graph of one example of a signal envelope and a digital envelope signal.

FIG. 8 is a graph 140 of one example of a signal envelope 141 and a digital envelope signal 142. The signal envelope 141 corresponds to one example of an envelope of an RF signal, and the digital envelope signal 142 corresponds to a digital representation of the signal envelope 141.

As shown in FIG. 8, changes to the digital envelope signal 142 can be self-aligned. The digital envelope signal 142 can provide enhanced performance relative to an analog envelope signal, which may have high frequency loss when sent to an envelope tracker.

Additionally, in certain configurations, the digital envelope signal 142 can be processed using digital signal processing (DSP) techniques to achieve high linearity and efficiency, which can enhance performance and/or permit the use of CMOS processing technologies for power amplification.

Figure 9:
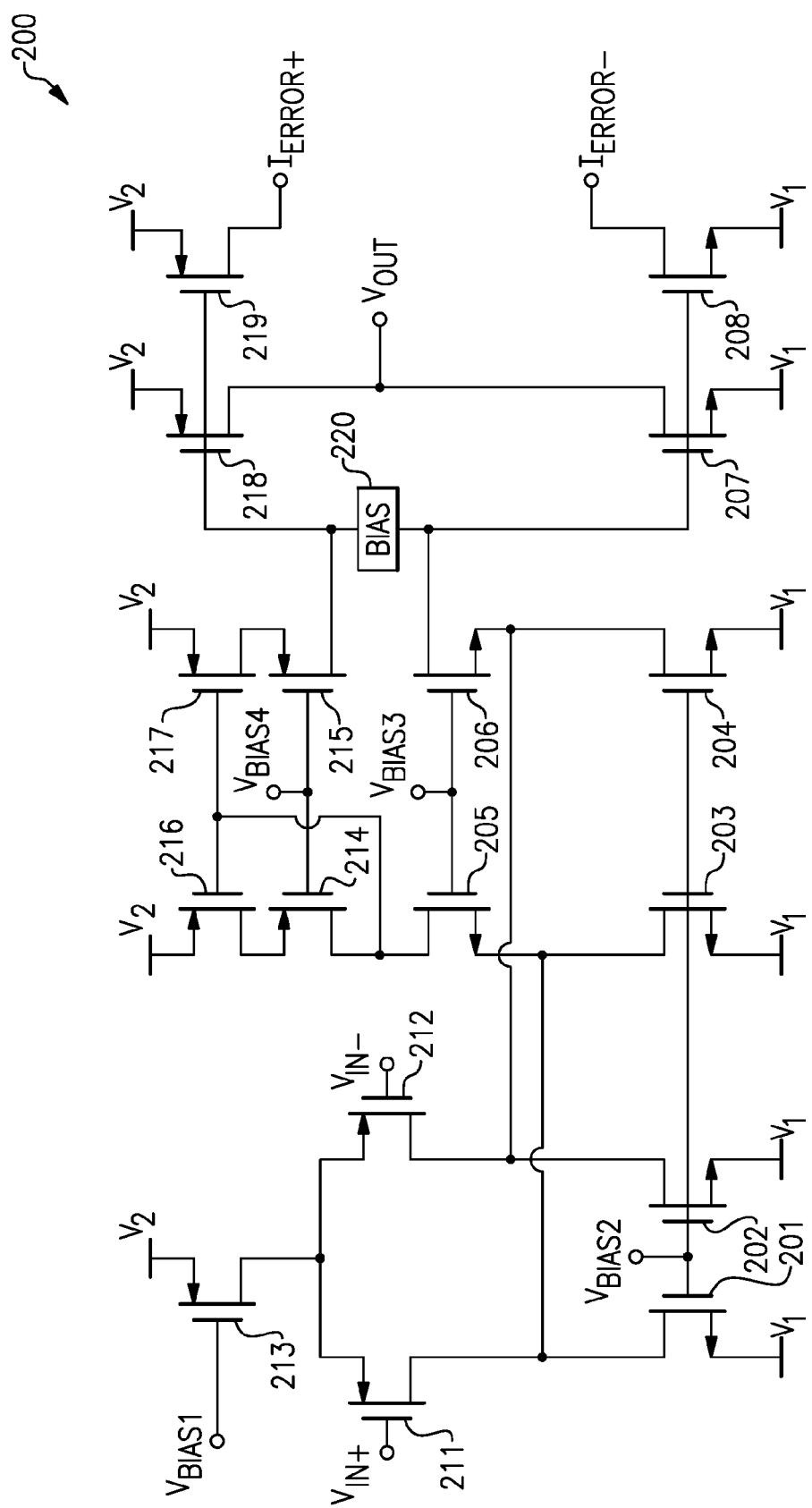
FIG. 9 is a circuit diagram of one example of an error amplifier.

FIG. 9 is a circuit diagram of one example of an error amplifier 200, which can be used, for example, in the embodiments described herein. Although FIG. 9 illustrates one example of an error amplifier, the teachings herein are applicable to a wide variety of error amplifiers.

The error amplifier 200 includes first to eighth NFETs 201-208, first to ninth PFETs 211-219, and a bias circuit 220. The error amplifier 200 is configured to receive a differential input voltage $V_{IN+}$, $V_{IN-}$, to generate an output voltage $V_{OUT}$, and to generate a differential error current $I_{ERROR+}$, $I_{ERROR-}$. The differential input voltage $V_{IN+}$, $V_{IN-}$ can be associated with a difference between a positive or first input voltage $V_{IN+}$ and a negative or second input voltage $V_{IN-}$.

The first PFET 211 includes a gate configured to receive the positive input voltage $V_{IN+}$, and a source electrically connected to a source of the second PFET 212 and to a drain of the third PFET 213. The first PFET 211 further includes a drain electrically connected to a drain of the first NFET 201, to a drain of the third NFET 203, and to a source of the fifth NFET 205. The second PFET 212 further includes a gate configured to receive the negative input voltage $V_{IN-}$, and a drain electrically connected to a drain of the second NFET 202, to a drain of the fourth NFET 204, and to a source of the sixth NFET 206. The third PFET 213 further includes a gate configured to receive a first bias voltage $V_{BIAS1}$, and a source electrically connected to the power high supply voltage $V_2$. The first NFET 201 further includes a gate electrically connected to a gate of the second NFET 202, to a gate of the third NFET 203, and to a gate of the fourth NFET 204 at a node configured to receive a second bias voltage $V_{BIAS2}$. The first to fourth NFETs 201-204 each further include a source electrically connected to the power low supply voltage $V_1$.

The fifth NFET 205 further includes a gate electrically connected to a gate of the sixth NFET 206 at a node configured to receive a third bias voltage $V_{BIAS3}$. The fifth NFET 205 further includes a drain electrically connected to a gate of the sixth PFET 216, to a gate of the seventh PFET 217, and to a drain of the fourth PFET 214. The fourth PFET 214 further includes a gate electrically connected to a gate of the fifth PFET 215 at a node configured to receive a fourth bias voltage $V_{BIAS4}$. The fourth PFET 214 further includes a source electrically connected to a drain of the sixth PFET 216. The sixth and seventh PFETs 216, 217 each further include a source electrically connected to the power high supply voltage $V_2$. The seventh PFET 217 further includes a drain electrically connected to a source of the fifth PFET 215. The fifth PFET 215 further includes a drain electrically connected to a gate of the eighth PFET 218, to a gate of the ninth PFET 219, and to a first terminal of the bias circuit 220.

The eighth PFET 218 further includes a drain electrically connected to a drain of the seventh NFET 207 and configured to generate the output voltage $V_{OUT}$. The ninth PFET 219 further includes a drain configured to generate the positive error current $I_{ERROR+}$. The eighth and ninth PFETs 218, 219 each further include a source electrically connected to the power high supply voltage $V_2$. The eighth NFET 208 further includes a drain configured to generate the negative error current $I_{ERROR-}$, and a gate electrically connected to a gate of the seventh NFET 207, to a drain of the sixth NFET 206, and to a second terminal of the bias circuit 220. The seventh and eighth NFETs 207, 208 each further include a source electrically connected to the power low supply voltage $V_1$.

The bias circuit 220 can be any suitable bias circuit. For example, in one implementation the bias circuit 220 includes a PFET and an NFET electrically connected in parallel with the channels of the PFET and the NFET disposed between the first and second terminals of the bias circuit 220. However, other configurations of the bias circuit 220 can be used.

The error amplifier 200 can be used to amplify the differential input voltage $V_{IN+}$, $V_{IN-}$ to generate the output voltage $V_{OUT}$. For example, the first and second PFETs 211, 212 can operate as a differential transistor pair, and the first to sixth NFETs 201-206 and the fourth to seventh PFETs 214-217 can operate as a folded cascode amplification structure. Additionally, the seventh NFET 207 and the eighth PFET 218 can operate as an output stage of the error amplifier 200.

As shown in FIG. 9, the eighth NFET 208 and the ninth PFET 219 can be configured to receive the gate voltages of the seventh NFET 207 and the eighth PFET 218, respectively. Since the seventh NFET 207 and the eighth PFET 218 can operate as an output stage of the error amplifier 200, electrically connecting the gates of the eighth NFET 208 and the ninth PFET 219 in this manner can be used to generate a differential error current $I_{ERROR+}$, $I_{ERROR-}$ that tracks the output current of the error amplifier 200. In certain implementations, the eighth NFET 208 is a replica transistor of the seventh NFET 207, and the ninth PFET 219 is a replica transistor of the eighth PFET 218.

The first to fourth bias voltages $V_{BIAS1}$-$V_{BIAS4}$ can be any suitable voltages. As persons having ordinary skill in the art will appreciate, the voltage levels can be selected based on a variety of factors, including, for example, a particular application and/or manufacturing process.

Although FIG. 9 illustrates one example of an error amplifier suitable for use with the envelope tracking systems described herein, other error amplifier configurations can be used in accordance with the envelope tracking schemes described herein.

APPLICATIONS

Some of the embodiments described above have provided examples in connection with wireless devices or mobile phones. However, the principles and advantages of the embodiments can be used for any other systems or apparatus that have needs for envelope trackers.

Such envelope trackers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wideband envelope tracking system comprising:
a DC-to-DC converter configured to generate a regulated voltage based on a combined error current;
a first error amplifier configured to generate a first error current and a first output voltage based on a first envelope current;
a second error amplifier configured to generate a second error current and a second output voltage based on a second envelope current;
a first combiner configured to generate a first power amplifier supply voltage based on combining the regulated voltage and the first output voltage; and
an error current processing circuit configured to generate the combined error current based on combining a plurality of error currents including the first error current and the second error current.

2. The wideband envelope tracking system of claim 1 further comprising a current digital-to-analog converter configured to receive a first digital envelope signal and to generate the first envelope current.

3. The wideband envelope tracking system of claim 2 wherein the first current digital-to-analog converter includes a plurality of level-shifters and a plurality of resistors, the plurality of level-shifters configured to generate a plurality of level-shifted bits by level-shifting a plurality of bits of the first digital envelope signal and to provide the plurality of level-shifted bits to the plurality of resistors.

4. The wideband envelope tracking system of claim 1 wherein the first error amplifier includes a current output that provides the first error current, a voltage output that provides the first output voltage, and an inverting input that receives the first envelope current.

5. The wideband envelope tracking system of claim 4 further comprising a feedback circuit electrically connected between the voltage output of the first error amplifier and the inverting input of the first error amplifier.

6. The wideband envelope tracking system of claim 1 wherein the error current processing circuit is configured to generate the combined error current based on averaging the plurality of error currents.

7. The wideband envelope tracking system of claim 1 further comprising a second combiner configured to generate a second power amplifier supply voltage based on combining the regulated voltage and the second output voltage.

8. A method of wideband envelope tracking in a mobile device, the method comprising:
generating a regulated voltage based on a combined error current using a DC-to-DC converter;
generating a first error current and a first output voltage based on a first envelope current using a first error amplifier;
generating a second error current and a second output voltage based on a second envelope current using a second error amplifier;

combining the regulated voltage and the first output voltage to generate a first power amplifier supply voltage using a first combiner; and combining a plurality of error currents including the first error current and the second error current to generate the combined error current using an error current processing circuit.

9. The method of claim 8 further comprising generating the first envelope current based on a first digital envelope signal using a current digital-to-analog converter.

10. The method of claim 9 wherein generating the first envelope current based on the first digital envelope signal includes level-shifting a plurality of bits of the first digital envelope signal using a plurality of level-shifters of the current digital-to-analog converter, providing the plurality of level-shifted bits to a plurality of resistors of the current digital-to-analog converter, and generating the first envelope current based on a flow of current through the plurality of resistors.

11. The method of claim 8 wherein combining a plurality of error currents includes averaging the plurality of error currents using the error current processing circuit.

12. The method of claim 8 further comprising combining the regulated voltage and the second output voltage to generate a second power amplifier supply voltage using a second combiner.

13. A mobile device comprising:
a first power amplifier configured to receive a first power amplifier supply voltage and to provide amplification to a first radio frequency signal;
a DC-to-DC converter configured to generate a regulated voltage based on a combined error current;
a first error amplifier configured to generate a first error current and a first output voltage based on a first envelope current that changes based on an envelope of the first radio frequency signal;
a second error amplifier configured to generate a second error current and a second output voltage based on a second envelope current;
a first combiner configured to generate the first power amplifier supply voltage based on combining the regulated voltage and the first output voltage; and
an error current processing circuit configured to generate the combined error current based on combining a plurality of error currents including the first error current and the second error current.

14. The mobile device of claim 13 further comprising a current digital-to-analog converter configured to receive a first digital envelope signal and to generate the first envelope current.

15. The mobile device of claim 14 further comprising a transceiver configured to generate the first digital envelope signal and the first radio frequency signal.

16. The mobile device of claim 13 wherein the first error amplifier includes a current output that provides the first error current, a voltage output that provides the first output voltage, and an inverting input that receives the first envelope current.

17. The mobile device of claim 16 further comprising a feedback circuit electrically connected between the voltage output of the first error amplifier and the inverting input of the first error amplifier.

18. The mobile device of claim 13 wherein the error current processing circuit is configured to generate the combined error current based on averaging the plurality of error currents.

19. The mobile device of claim 13 further comprising a second combiner configured to generate a second power amplifier supply voltage based on combining the regulated voltage and the second output voltage.

20. The mobile device of claim 19 further comprising a second power amplifier configured to receive the second power amplifier supply voltage and to provide amplification to a second radio frequency signal.

* * * * *